(12) United States Patent
Ho et al.

(10) Patent No.: US 11,823,746 B2
(45) Date of Patent: Nov. 21, 2023

(54) MEMORY SECTOR WITH TRIMMED REFERENCE CURRENTS AND METHOD OF IMPROVING MEMORY READING WINDOW THEREOF

(71) Applicant: UNITED MICROELECTRONICS CORP., Hsin-Chu (TW)

(72) Inventors: Ming-Shan Ho, Hsinchu (TW); Ying-Ting Lin, Hsinchu County (TW); Chung-Yi Luo, Hsinchu County (TW); Kuo-Cheng Chou, Hsinchu County (TW); Cheng-Hsiao Lai, Chiayi County (TW); Ming-Jen Chang, Kaohsiung (TW); Yung-Tsai Hsu, Hsinchu County (TW); Cheng-Chieh Cheng, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 38 days.

(21) Appl. No.: 17/673,829

(22) Filed: Feb. 17, 2022

(65) Prior Publication Data
US 2023/0223091 A1    Jul. 13, 2023

(30) Foreign Application Priority Data
Jan. 11, 2022    (CN) .......................... 202210027156.3

(51) Int. Cl.
*G11C 16/28* (2006.01)
*G11C 16/24* (2006.01)
*G11C 16/08* (2006.01)
*G11C 16/10* (2006.01)

(52) U.S. Cl.
CPC .............. *G11C 16/28* (2013.01); *G11C 16/08* (2013.01); *G11C 16/102* (2013.01); *G11C 16/24* (2013.01)

(58) Field of Classification Search
None
See application file for complete search history.

(56) References Cited

U.S. PATENT DOCUMENTS

| 7,463,516 | B2 | 12/2008 | Ban |  |
| 8,040,725 | B2 | 10/2011 | Kang |  |
| 2022/0066870 | A1* | 3/2022 | Choi | ................... G06F 11/1068 |

* cited by examiner

*Primary Examiner* — Kretelia Graham
(74) *Attorney, Agent, or Firm* — Winston Hsu

(57) ABSTRACT

A memory sector with trimmed reference currents, including eight unit cells corresponding to an even word line and eight unit cells corresponding to an odd word line, and each unit cell has erased state and programmed state, wherein the logic state of unit cell corresponding to the odd word line is determined by a first reference current based on cell currents of the 8 unit cells corresponding to the even word line in programmed state and cell currents of the eight unit cells corresponding to the odd word line in erased state, and the logic state of unit cell corresponding to the even word line is determined by a second reference current based on cell currents of the eight unit cells corresponding to the even word line in erased state and cell currents of the 8 unit cells corresponding to the odd word line in programmed state.

16 Claims, 3 Drawing Sheets

MEMORY SECTOR WITH TRIMMED REFERENCE CURRENTS AND METHOD OF IMPROVING MEMORY READING WINDOW THEREOF

BACKGROUND OF THE INVENTION

1. Field of the Invention

The present invention relates generally to a memory sector and method of improving memory reading window thereof, and more specifically, to a memory sector with trimmed reference currents and method of improving memory reading window thereof.

2. Description of the Prior Art

A reference current will be predetermined in the operation of flash memory through trimming method to make sure memory cells have expected current level in the procedure of programming and erasing. A sensing circuit will be used in these procedures to monitor logic states of these memory cells and the current level of these memory cells will be sensed and determined during the read operation.

Nevertheless, the predetermined reference current may be varied if the uniformity of memory is not well controlled in the manufacturing process. For example, large alignment shift between contacts and the connected polysilicon based active areas in the memory may result in performance variation between unit cells corresponding two adjacent word lines. The cell current measured in these operations will be quite inconsistent and apparent phenomenon of even-odd disparity would appear between adjacent word lines (i.e. adjacent even and odd word lines). Generally, this kind of issue may be solved by further restricting the specification limit of alignment shift between contacts and active areas. However, this approach sometimes will be a challenge due to various uncontrollable factors and process limits during the manufacturing process. Accordingly, it is necessary for those of skilled in the art to develop new memory structure and method of reading and determining thereof, in response to the issue of inconsistent property between memory cells.

SUMMARY OF THE INVENTION

In order to solve the aforementioned issue of inconsistent property of unit cells corresponding to odd word lines and even word lines, the present invention hereby provides a novel memory sector with trimmed reference currents and method of improving memory reading window thereof, with features of deriving different reference currents used in read operation for the unit cells corresponding respectively to odd word lines and even word lines One aspect of the present invention is to provide a memory sector with trimmed reference currents, including eight unit cells corresponding to an even word line and eight unit cells corresponding to an odd word line, and each unit cell has erased state and programmed state, wherein a logic state of the unit cell corresponding to the odd word line is determined by a first reference current based on cell currents of the eight unit cells corresponding to the even word line in programmed state and cell currents of the eight unit cells corresponding to the odd word line in erased state, and a logic state of the unit cell corresponding to the even word line is determined by a second reference current based on cell currents of the eight unit cells corresponding to the even word line in erased state and cell currents of the eight unit cells in the odd word line in programmed state.

Another aspect of the present invention is to provide a method of improving memory reading window by trimming reference currents, including steps of providing a memory sector having eight unit cells corresponding to an even word line and eight unit cells corresponding to an odd word line, and each unit cell has erased state and programmed state, defining a first reference current based on cell currents of the eight unit cells corresponding to the even word line in programmed state and cell currents of the eight unit cells corresponding to the odd word line in erased state, and the first reference current is used to determine a logic state of the unit cell corresponding to the odd word line, and defining a second reference current based on cell currents of the eight unit cells corresponding to the even word line in erased state and cell currents of the eight unit cells corresponding to the odd word line in programmed state, and the second reference current is used to determine a logic state of the unit cell corresponding to the even word line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
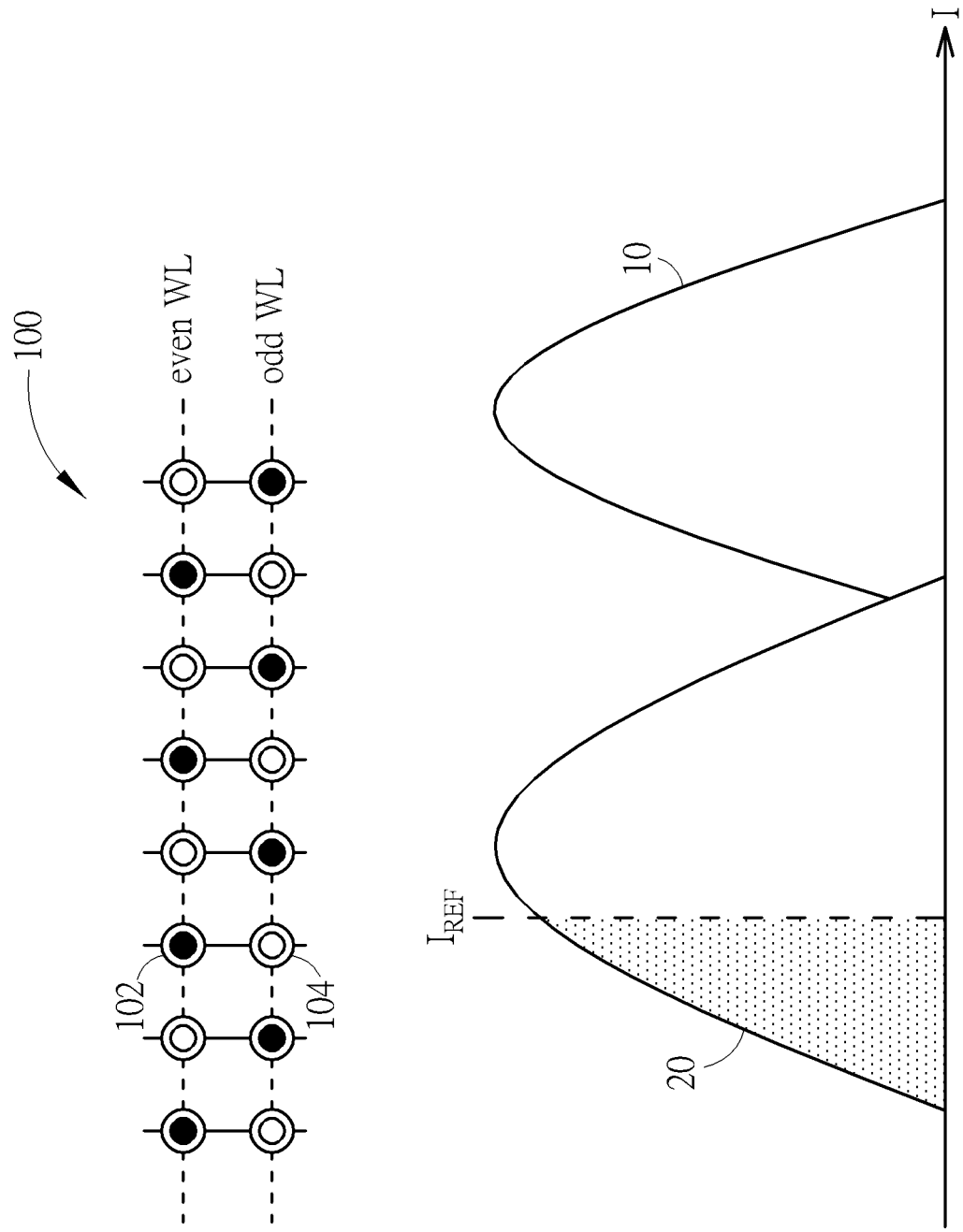
FIG. 1 is a distribution graph of the number of unit cell corresponding respectively to odd word lines and even word lines in erased state along with the cell current in prior art.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The memory structure and relevant method of present invention is primarily applied in the architecture of embedded flash memory (eflash). A flash memory device is a kind of integrated circuit capable of storing information and reading out information, if necessary. The flash memory device may include multiple memory cells that are rewritten with data. Each memory cell may store one-bit data or multi-bit data. In the case of storing one-bit data in a unit memory cell, the memory cell is conditioned in one of two possible threshold-voltage distributions, i.e., one of two data states "1" and "0". The following embodiments are all based on the reading of memory structure that stores one-bit data. Nevertheless, please note that the present invention is not limited in one-bit data, instead, it may be applied in the reading of multi-bit data.

Please refer to FIG. 1, which is a distribution graph of the number of unit cell corresponding respectively to odd word lines and even word lines in erased state ("1" logic state) along with the cell current in prior art. The X-coordinate in FIG. 1 represents a cell current I of a unit cell in erased state, while the Y-coordinate in FIG. 1 is number of the unit cell. The normal distribution curve shown in the figure is the number distribution of unit cell in the measured cell current for all unit cells in entire memory, wherein the distribution curve 10 on the right is the number distribution of unit cells corresponding to odd word lines, while the distribution curve 20 on the left is the number distribution of unit cells corresponding to even word lines. It can be seen from the figure that not all unit cells are provided with ideal, consistent cell current due to process variation. Instead, their number is presented in a normal distribution. Furthermore, some processes or memory architectures may easily lead to apparent even-odd disparity between odd word lines and even word lines. For example, the average cell current of distribution curve 20 of unit cells corresponding to even word lines is apparently less than the average cell current of distribution curve 10 of unit cells corresponding to odd word lines, wherein the normal distribution range of the current of distribution curve 20 on the left is further greater than the one of distribution curve 10 on the right, representing that the property of unit cells corresponding to even word lines are more inconsistent.

Refer still to FIG. 1. In the read operation of flash memory, a reference current $I_{REF}$ will be provided as a criteria to determine if an unit cell is in erased state (logic state "1") or in programmed state (logic state "0"). In normal trimming method as shown in FIG. 1, a memory sector 100 is usually defined from main array region. The memory sector 100 may correspond to two adjacent word lines, including an even word line (even WL) and an odd word line (odd WL), wherein eight unit cells 102 correspond to the even word line and eight unit cells 104 correspond to the odd word line. Each unit cell 102 or 104 has two logic states, i.e. erased state (denoted by hollow dot) and programmed state (denoted by solid dot) in the figure. Conventional trimming approach is to randomly program eight unit cells in the memory sector 100 into programmed state and the other eight unit cells into erased state, and cell currents of these unit cells are measured, wherein the reference current $I_{REF}$ is defined as an average cell currents of these sixteen unit cells in this random pattern of logic states.

Refer still to FIG. 1. An unit cell is determined as being in erase state if its cell current is read to be greater than the reference current $I_{REF}$, while an unit cell is determined as being in programmed state if its cell current is read to be less than the reference current $I_{REF}$. Take the embodiment in the figure as an example, the distribution curve 10 and the distribution curve 20 are real distributions of unit cells corresponding to the odd word line and the even word line in erased state. Ideally, the distribution curve 10 and the distribution curve 20 in erased state should both be located on the right side of the reference current $I_{REF}$. However, it can be seen in the figure that, in real practice, a part of the distribution curve 20 (shaded area in the figure) is located on the left side of the reference current $I_{REF}$, which represents that a portion of the unit cells corresponding to even word lines in erased state are determined as being in programmed state, thereby causing read error.

Figure 2:
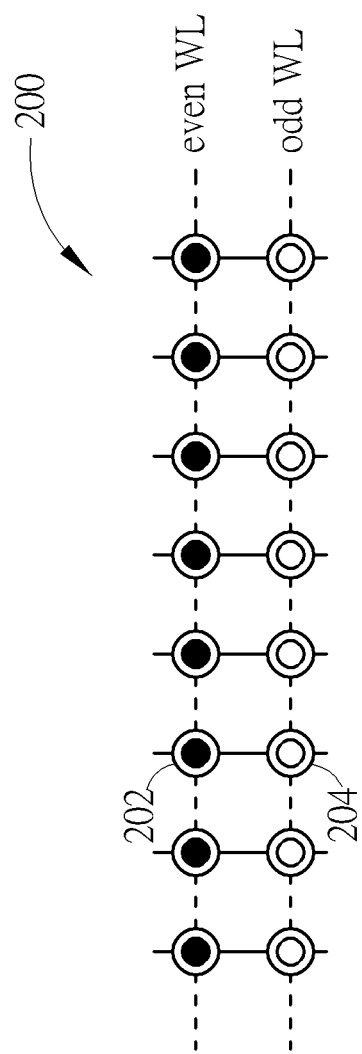
FIG. 2 is a distribution graph of the number of unit cell corresponding to odd word lines in erased state along with the cell current in the preferred embodiment of the present invention.
Figure 2:
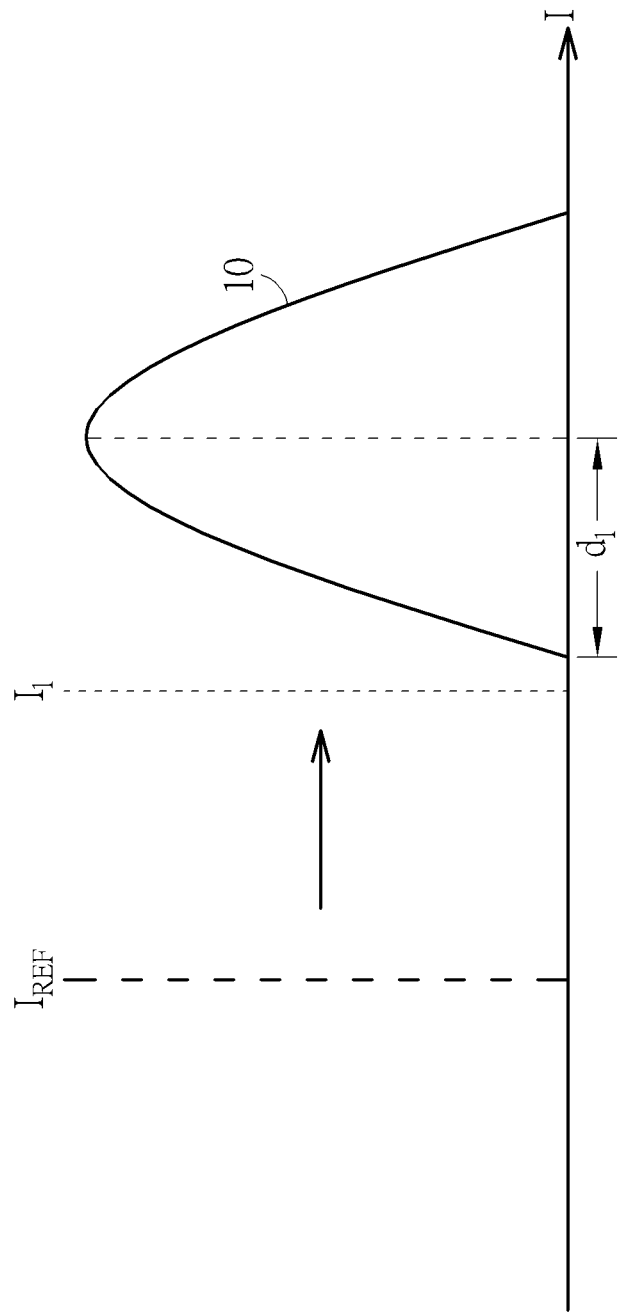

To solve this issue, please refer to FIG. 2, which is a distribution graph of the number of unit cells corresponding to odd word lines in erased state along with the cell current in the preferred embodiment of present invention. In this embodiment, similarly, a memory sector 200 is provided with corresponding two adjacent word lines, including an even word line (even WL) and an odd word line (odd WL), wherein eight unit cells 202 correspond to the even word line and eight unit cells 204 correspond to the odd word line. Each unit cell 202 or 204 has two logic states, i.e. erased state (denoted by hollow dot) and programmed state (denoted by solid dot) in the figure. Different from the conventional skill, the reference current of present invention is not derived from eight unit cells in programmed state and eight unit cells in erased state in random pattern in the memory sector 200. As shown in FIG. 2, when define a reference current $I_1$ for the unit cells corresponding to the odd word line, eight unit cells corresponding to the even WL in the memory sector 200 are all programmed into programmed state and eight unit cells corresponding to the odd WL in the memory sector 200 are all erased into erased state, and cell currents of these unit cells are then measured, wherein the reference current $I_1$ for the unit cells corresponding to the odd word line is defined as an average cell current of these sixteen unit cells in this pattern of logic states. Alternatively, in some embodiments, the reference current $I_1$ for the unit cells corresponding to the odd word line is defined as an average cell current of these sixteen unit cells in this pattern of logic states subtracting a predetermined value. This predetermined value is preferably greater than half of normal distribution range of the current of unit cells corresponding to the odd word line (i.e. range $d_1$ in the figure).

Refer still to FIG. 2. The advantage of aforementioned approach of present invention is that, due to process variation and even-odd disparity of word lines, the average cell current of unit cells corresponding to the odd word line (i.e.

the distribution curve 10 in the figure) would be way over the reference current $I_{REF}$ defined by conventional method. Therefore, in the approach of present invention, all of eight unit cells in erased state are corresponded to the odd word line rather than randomly sampling, and the reference current $I_1$ calculated in this way will be greater than the originally-defined reference current $I_{REF}$ and will be closer to the performance of unit cells corresponding to the odd word line in real practice, make it suitable as a reference current for determining the logic state of unit cells corresponding to the odd word line. Accordingly, in read operation, an unit cell corresponding to the odd word line is determined as being in erased state if its cell current is read to be greater than the reference current $I_1$, while an unit cell corresponding to the odd word line is determined as being in programmed state if its cell current is read to be less than the reference current $I_1$.

Figure 3:
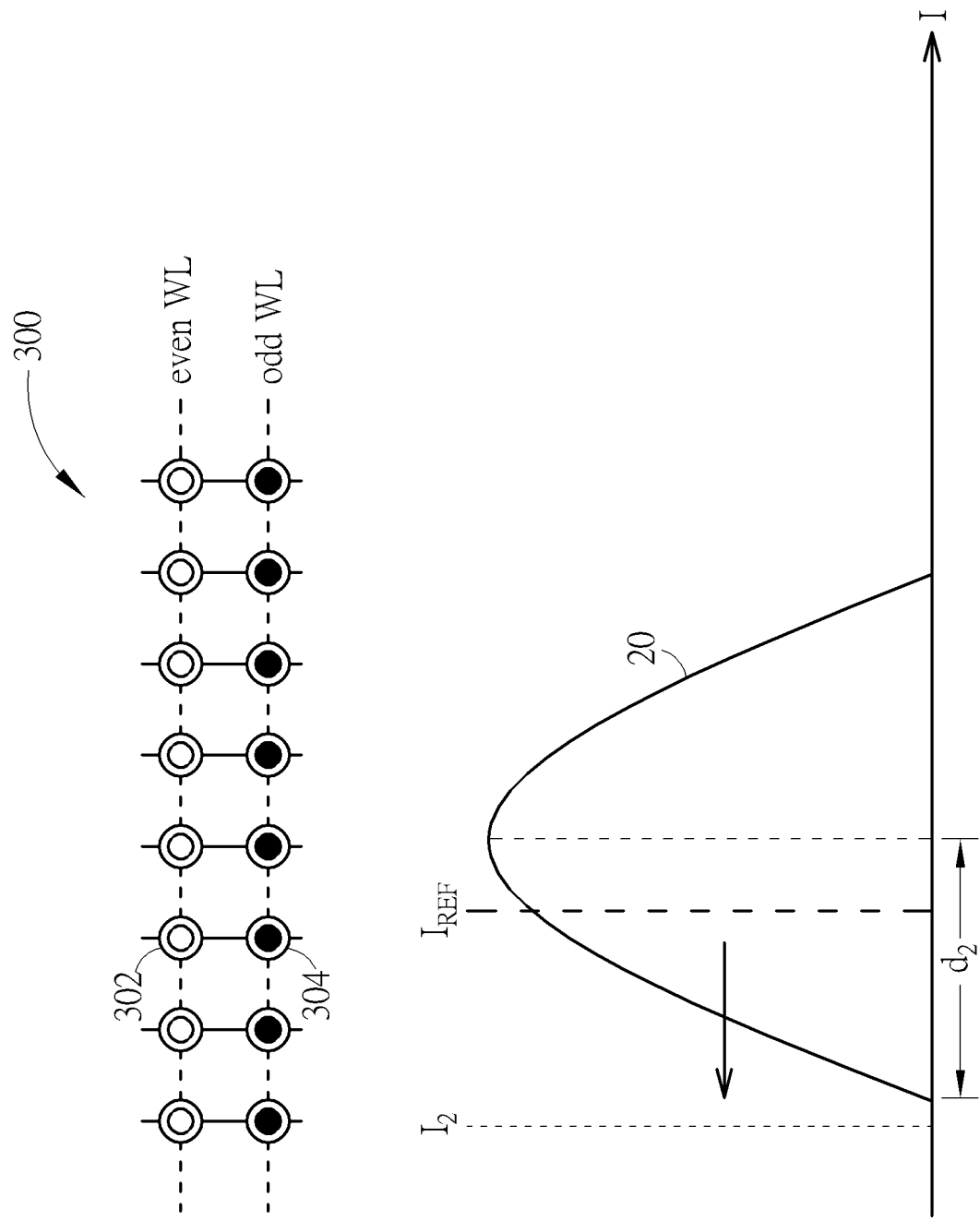
FIG. 3 is a distribution graph of the number of unit cell corresponding to even word lines in erased state along with the cell current in the preferred embodiment of the present invention.

Please refer now to FIG. 3, which is a distribution graph of the number of unit cells corresponding to even word lines in erased state along with the cell current in the preferred embodiment of present invention. In this embodiment, similarly, a memory sector 300 is provided with corresponding two adjacent word lines, including an even word line (even WL) and an odd word line (odd WL), wherein eight unit cells 302 correspond to the even word line and eight unit cells 304 correspond to the odd word line. Each unit cell 302 or 304 has two logic states, i.e. erased state (denoted by hollow dot) and programmed state (denoted by solid dot) in the figure. Different from the conventional skill, the reference current of present invention is not derived from eight unit cells in programmed state and eight unit cells in erased state in random pattern or arrangement in the memory sector 300. As shown in FIG. 3, when define a reference current $I_2$ for the unit cells corresponding to the even word line, eight unit cells corresponding to the odd WL in the memory sector 300 are all programmed into programmed state and eight unit cells corresponding to the even WL in the memory sector 300 are all erased into erased state, and cell currents of these unit cells are then measured, wherein the reference current $I_2$ for the unit cells corresponding to the even word line is defined as an average cell current of these sixteen unit cells in this pattern of logic states. Alternatively, in some embodiments, the reference current $I_2$ for the unit cells corresponding to the even word line is defined as an average cell current of these sixteen unit cells in this pattern of logic states subtracting a predetermined value. This predetermined value is preferably greater than half of normal distribution range of the current of unit cells corresponding to the even word line (i.e. range $d_2$ in the figure).

Refer still to FIG. 3. The advantage of aforementioned approach of present invention is that, due to process variation and even-odd disparity of word lines, the average cell current of unit cells corresponding to the even word line (i.e. the distribution curve 20 in the figure) would be very close to the reference current $I_{REF}$ defined by conventional method, so that an edge portion of the distribution curve 20 on the left would easily lie in the range of original reference current $I_{REF}$, thereby causing read error. In the light of this, in the approach of present invention, all of eight unit cells in erased state are designedly corresponded to the even word line rather than randomly sampling, and the reference current $I_2$ calculated in this way will be less than the originally-defined reference current $I_{REF}$ and will be closer to the performance of unit cells corresponding to the even word line in real practice, make it suitable as a reference current for determining the logic state of unit cells corresponding to the even word line. Accordingly, in read operation, an unit cell corresponding to the even word line is determined as being in erased state if its cell current is read to be greater than the reference current $I_2$, while an unit cell corresponding to the even word line is determined as being in programmed state if its cell current is read to be less than the reference current $I_2$.

In conclusion to the aforementioned embodiments, it can be understood that the essential feature of the present invention is to derive different reference currents used respectively for the unit cells corresponding to odd word lines and even word lines in read and determination operation through trimming method, in order to solve the issue of reading error due to inconsistent current performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory sector with trimmed reference currents, comprising eight unit cells corresponding to an even word line and eight unit cells corresponding to an odd word line, and each unit cell has erased state and programmed state, wherein a logic state of said unit cell corresponding to said odd word line is determined by a first reference current based on cell currents of said eight unit cells corresponding to said even word line in programmed state and cell currents of said eight unit cells corresponding to said odd word line in erased state, and a logic state of said unit cell corresponding to said even word line is determined by a second reference current based on cell currents of said eight unit cells corresponding to said even word line in erased state and cell currents of said eight unit cells in said odd word line in programmed state, wherein said first reference current is a first average cell current obtained by averaging cell currents of said eight unit cells corresponding to said even word line in programmed state and cell currents of said eight unit cells corresponding to said odd word line in erased state.

2. The memory sector with trimmed reference currents of claim 1, wherein a first average cell current is obtained by averaging cell currents of said eight unit cells corresponding to said even word line in programmed state and cell currents of said eight unit cells corresponding to said odd word line in erased state, and said first reference current equals to said first average cell current subtracting a predetermined value.

3. The memory sector with trimmed reference currents of claim 2, wherein said predetermined value is greater than half of normal distribution range of a current of said unit cell corresponding to said odd word line.

4. The memory sector with trimmed reference currents of claim 1, wherein said second reference current is a second average cell current obtained by averaging cell currents of said eight unit cells corresponding to said even word line in erased state and cell currents of said eight unit cells corresponding to said odd word line in programmed state.

5. The memory sector with trimmed reference currents of claim 1, wherein a second average cell current is obtained by averaging cell currents of said eight unit cells corresponding to said even word line in erased state and cell currents of said eight unit cells corresponding to said odd word line in programmed state, and said second reference current equals to said second average cell current subtracting a predetermined value.

6. The memory sector with trimmed reference currents of claim 5, wherein said predetermined value is greater than half of normal distribution range of a current of said unit cell corresponding to said even word line.

7. The memory sector with trimmed reference currents of claim 1, wherein said unit cell is determined as being in erased state if said cell current of said unit cell corresponding to said odd word line is greater than said first reference current, and said unit cell is determined in programmed state if said cell current of said unit cell corresponding to said odd word line is less than said first reference current.

8. The memory sector with trimmed reference currents of claim 1, wherein said unit cell is determined as being in erased state if said cell current of said unit cell corresponding to said even word line is greater than said second reference current, and said unit cell is determined in programmed state if said cell current of said unit cell corresponding to said even word line is less than said second reference current.

9. A method of improving memory reading window by trimming reference currents, comprising:
  providing a memory sector comprising eight unit cells corresponding to an even word line and eight unit cells corresponding to an odd word line, and each unit cell has erased state and programmed state;
  defining a first reference current and obtaining said first reference current by averaging cell currents of said eight unit cells corresponding to said even word line in programmed state and cell currents of said eight unit cells corresponding to said odd word line in erased state, and said first reference current is used to determine a logic state of said unit cell corresponding to said odd word line; and
  defining a second reference current based on cell currents of said eight unit cells corresponding to said even word line in erased state and cell currents of said eight unit cells corresponding to said odd word line in programmed state, and said second reference current is used to determine a logic state of said unit cell corresponding to said even word line.

10. The method of improving memory reading window by trimming reference currents of claim 9, wherein steps of defining said first reference current comprises:
  obtaining a first average unit current by averaging cell currents of said eight unit cells corresponding to said even word line in programmed state and cell currents of said eight unit cells corresponding to said odd word line in erased state; and
  defining said first reference current as said first average unit current subtracting a predetermined value.

11. The method of improving memory reading window by trimming reference currents of claim 10, wherein said predetermined value is greater than half of normal distribution range of a current of said unit cell corresponding to said odd word line.

12. The method of improving memory reading window by trimming reference currents of claim 9, wherein steps of defining said second reference current comprises:
  obtaining a second average unit current by averaging cell currents of said eight unit cells corresponding to said even word line in erased state and cell currents of said eight unit cells corresponding to said odd word line in programmed state; and
  defining said second reference current as said second average unit current.

13. The method of improving memory reading window by trimming reference currents of claim 9, wherein steps of defining said second reference current comprises:
  obtaining a second average unit current by averaging cell currents of said eight unit cells corresponding to said even word line in erased state and cell currents of said eight unit cells corresponding to said odd word line in programmed state; and
  defining said second reference current as said second average unit current subtracting a predetermined value.

14. The method of improving memory reading window by trimming reference currents of claim 13, wherein said predetermined value is greater than half of normal distribution range of a current of said unit cell corresponding to said even word line.

15. The method of improving memory reading window by trimming reference currents of claim 9, further comprising:
  reading said cell currents of said unit cells;
  determining said unit cell as being in erased state if said cell current of said unit cell corresponding to said odd word line is greater than said first reference current; and
  determining said unit cell as being in programmed state if said cell current of said unit cell corresponding to said odd word line is less than said first reference current.

16. The method of improving memory reading window by trimming reference currents of claim 9, further comprising:
  reading said cell currents of said unit cells;
  determining said unit cell as being in erased state if said cell current of said unit cell corresponding to said even word line is greater than said second reference current; and
  determining said unit cell as being in programmed state if said cell current of said unit cell corresponding to said even word line is less than said second reference current.

* * * * *